(12) United States Patent
Zhamu et al.

(10) Patent No.: US 10,526,204 B2
(45) Date of Patent: Jan. 7, 2020

(54) PRODUCTION OF GRAPHENE MATERIALS DIRECTLY FROM CARBON/GRAPHITE PRECURSOR

(71) Applicant: Nanotek Instruments, Inc., Dayton, OH (US)

(72) Inventors: Aruna Zhamu, Springboro, OH (US); Bor Z. Jang, Centerville, OH (US)

(73) Assignee: Global Graphene Group, Inc., Dayton, OH (US)

( * ) Notice: Subject to any disclaimer, the term of this patent is extended or adjusted under 35 U.S.C. 154(b) by 0 days.

(21) Appl. No.: 15/700,756

(22) Filed: Sep. 11, 2017

(65) Prior Publication Data

US 2019/0077669 A1   Mar. 14, 2019

(51) Int. Cl.

| | | |
|---|---|---|
| C01B 32/188 | (2017.01) | |
| C01B 32/186 | (2017.01) | |
| C01B 32/225 | (2017.01) | |
| C01B 32/192 | (2017.01) | |
| C01B 32/184 | (2017.01) | |
| C01B 32/194 | (2017.01) | |
| C23C 16/26 | (2006.01) | |
| H01J 37/26 | (2006.01) | |

(52) U.S. Cl.
CPC .......... *C01B 32/188* (2017.08); *C01B 32/184* (2017.08); *C01B 32/186* (2017.08); *C01B 32/192* (2017.08); *C01B 32/194* (2017.08); *C01B 32/225* (2017.08); *C23C 16/26* (2013.01); *H01J 37/26* (2013.01)

(58) Field of Classification Search
CPC ... C01B 32/188; C01B 32/192; C01B 32/186; C01B 32/225; H01J 37/26; C23C 16/26
See application file for complete search history.

(56) References Cited

U.S. PATENT DOCUMENTS 2,798,878 A   7/1957 Hummers
6,872,330 B2   3/2005 Mack et al.
(Continued)

OTHER PUBLICATIONS

Anderson et al., "The Use of Esters of N-Hydroxysuccinimide in Peptide Synthesis" J. Amer. Chem. Soc. (1964) vol. 86, p. 1839-1840.
(Continued)

*Primary Examiner* — Richard M Rump

(57) ABSTRACT

Provided is a method of producing isolated graphene sheets directly from a carbon/graphite precursor. The method comprises: (a) providing a mass of aromatic molecules wherein the aromatic molecules are selected from petroleum heavy oil or pitch, coal tar pitch, a polynuclear hydrocarbon, or a combination thereof; (b) heat treating this mass and using chemical or mechanical means to form graphene domains dispersed in a disordered matrix of carbon or hydrocarbon molecules, wherein the graphene domains are each composed of from 1 to 30 planes of hexagonal carbon atoms or fused aromatic rings having a length or width from 5 nm to 20 μm and an inter-graphene space between two planes of hexagonal carbon atoms or fused aromatic rings no less than 0.4 nm; and (c) separating and isolating the planes of hexagonal carbon atoms or fused aromatic rings to recover graphene sheets from the disordered matrix.

25 Claims, 5 Drawing Sheets

(56) References Cited

U.S. PATENT DOCUMENTS

| 7,071,258 | B1* | 7/2006 | Jang | B82Y 30/00 |
| | | | | 423/445 B |
| 7,327,000 | B2 | 2/2008 | DeHeer et al. | |
| 8,883,114 | B2* | 11/2014 | Zhamu | B82Y 30/00 |
| | | | | 423/448 |
| 2015/0235741 | A1* | 8/2015 | Sumi | H01B 11/1083 |
| | | | | 174/36 |
| 2017/0037257 | A1* | 2/2017 | Yang | C09D 5/084 |

OTHER PUBLICATIONS

Hummers et al., "Preparation of Graphitic Oxide" Journal of the American Chemical Society (1958) p. 1339.

Jang et al., "Processing of Nano Graphene Platelets (NGPs) and NGP Nanocomposites: A Review" J. Materials Sci. (2008) vol. 43, pp. 5092-5101.

Yang et al., "Two-dimensional Graphene Nano-ribbons" J. Am. Chem. Soc. (2008) vol. 130, pp. 4216-4217.

PCT/US18/49825 International Search Report and Written Opinion dated Nov. 5, 2018, 9 pages.

\* cited by examiner

PRODUCTION OF GRAPHENE MATERIALS DIRECTLY FROM CARBON/GRAPHITE PRECURSOR

FIELD OF THE INVENTION

The present invention relates to the art of graphene materials and, in particular, to a method of rapidly producing isolated graphene sheets in an environmentally benign manner.

BACKGROUND

A single-layer graphene sheet is composed of an atomic plane of carbon atoms occupying a two-dimensional hexagonal lattice. Multi-layer graphene is a platelet composed of more than one graphene plane. Individual single-layer graphene sheets and multi-layer graphene platelets are herein collectively called nano graphene platelets (NGPs) or graphene materials. Herein, NGPs include pristine graphene (essentially 99% of carbon atoms), slightly oxidized graphene 5% by weight of oxygen), graphene oxide ($\geq$5% by weight of oxygen), slightly fluorinated graphene (<5% by weight of fluorine), graphene fluoride (($\geq$5% by weight of fluorine), other halogenated graphene, and chemically functionalized graphene.

NGPs have been found to have a range of unusual physical, chemical, and mechanical properties. For instance, graphene was found to exhibit the highest intrinsic strength and highest thermal conductivity of all existing materials. Although practical electronic device applications for graphene (e.g., replacing Si as a backbone in a transistor) are not envisioned to occur within the next 5-10 years, its application as a nanofiller in a composite material and an electrode material in energy storage devices is imminent. The availability of processable graphene sheets in large quantities is essential to the success in exploiting composite, energy, and other applications for graphene.

Our research group studied graphene as early as 2002 [B. Z. Jang and W. C. Huang, "Nano-scaled Graphene Plates," U.S. patent application Ser. No. 10/274,473, submitted on Oct. 21, 2002; now U.S. Pat. No. 7,071,258 (Jul. 4, 2006)]. The processes for producing NGPs and NGP nanocomposites were reviewed by us [Bor Z. Jang and A Zhamu, "Processing of Nano Graphene Platelets (NGPs) and NGP Nanocomposites: A Review," J. Materials Sci. 43 (2008) 5092-5101]. Our research has yielded a process for rapid, cost-effective, and environmentally benign production of isolated graphene sheets. The process is novel in that is does not follow the established methods for production of nano graphene platelets outlined below. Four main prior-art approaches have been followed to produce NGPs. Their advantages and shortcomings are briefly summarized as follows:

Approach 1: Chemical Formation and Reduction of Graphite Oxide (GO)

The first approach (FIG. 1) entails treating natural graphite powder with an intercalant and an oxidant (e.g., concentrated sulfuric acid and nitric acid, respectively) to obtain a graphite intercalation compound (GIC) or, actually, graphite oxide (GO). [William S. Hummers, Jr., et al., Preparation of Graphitic Oxide, Journal of the American Chemical Society, 1958, p. 1339.] Prior to intercalation or oxidation, graphite has an inter-graphene plane spacing of approximately 0.335 nm ($L_d = \frac{1}{2} d_{002} = 0.335$ nm). With an intercalation and oxidation treatment, the inter-graphene spacing is increased to a value typically greater than 0.6 nm. This is the first expansion stage experienced by the graphite material during this chemical route. The obtained GIC or GO is then subjected to further expansion (often referred to as exfoliation) using either a thermal shock exposure or a solution-based, ultrasonication-assisted graphene layer exfoliation approach.

In the thermal shock exposure approach, the GIC or GO is exposed to a high temperature (typically 800-1,050° C.) for a short period of time (typically 15 to 60 seconds) to exfoliate or expand the GIC or GO for the formation of exfoliated or further expanded graphite, which is typically in the form of a "graphite worm" composed of graphite flakes that are still interconnected with one another. This thermal shock procedure can produce some separated graphite flakes or graphene sheets, but normally the majority of graphite flakes remain interconnected. Typically, the exfoliated graphite or graphite worm is then subjected to a flake separation treatment using air milling, mechanical shearing, or ultrasonication in water. Hence, approach 1 basically entails three distinct procedures: first expansion (oxidation or intercalation), further expansion (or "exfoliation"), and separation.

In the solution-based separation approach, the expanded or exfoliated GO powder is dispersed in water or aqueous alcohol solution, which is subjected to ultrasonication. It is important to note that in these processes, ultrasonification is used after intercalation and oxidation of graphite (i.e., after first expansion) and typically after thermal shock exposure of the resulting GIC or GO (after second expansion). Alternatively, the GO powder dispersed in water is subjected to an ion exchange or lengthy purification procedure in such a manner that the repulsive forces between ions residing in the inter-planar spaces overcome the inter-graphene van der Waals forces, resulting in graphene layer separations.

There are several major problems associated with this conventional chemical production process:
  (1) The process requires the use of large quantities of several undesirable chemicals, such as sulfuric acid, nitric acid, and potassium permanganate or sodium chlorate.
  (2) The chemical treatment process requires a long intercalation and oxidation time, typically 5 hours to five days.
  (3) Strong acids consume a significant amount of graphite during this long intercalation or oxidation process by "eating their way into the graphite" (converting graphite into carbon dioxide, which is lost in the process). It is not unusual to lose 20-50% by weight of the graphite material immersed in strong acids and oxidizers.
  (4) The thermal exfoliation requires a high temperature (typically 800-1,200° C.) and, hence, is a highly energy-intensive process.
  (5) Both heat- and solution-induced exfoliation approaches require a very tedious washing and purification step. For instance, typically 2.5 kg of water is used to wash and recover 1 gram of GIC, producing huge quantities of waste water that need to be properly treated.
  (6) In both the heat- and solution-induced exfoliation approaches, the resulting products are GO platelets that must undergo a further chemical reduction treatment to reduce the oxygen content. Typically, even after reduction, the electrical conductivity of GO platelets remains much lower than that of pristine graphene. Furthermore, the reduction procedure often involves the utilization of toxic chemicals, such as hydrazine.

(7) Furthermore, the quantity of intercalation solution retained on the flakes after draining may range from 20 to 150 parts of solution by weight per 100 parts by weight of graphite flakes (pph) and more typically about 50 to 120 pph. During the high-temperature exfoliation, the residual intercalate species retained by the flakes decompose to produce various species of sulfuric and nitrous compounds (e.g., $NO_x$ and $SO_x$), which are undesirable. The effluents require expensive remediation procedures in order not to have an adverse environmental impact.

The present invention was made to overcome the limitations outlined above.

Approach 2: Formation of Pristine Graphene

In 2002, our research team succeeded in isolating single-layer and multi-layer graphene sheets from partially carbonized or graphitized polymeric carbons, which were obtained from a polymer or pitch precursor [B. Z. Jang and W. C. Huang, "Nano-scaled Graphene Plates," U.S. patent application Ser. No. 10/274,473, submitted on Oct. 21, 2002; now U.S. Pat. No. 7,071,258 (Jul. 4, 2006)]. Mack, et al ["Chemical manufacture of nanostructured materials" U.S. Pat. No. 6,872,330 (Mar. 29, 2005)] developed a process that involved intercalating graphite with potassium melt and contacting the resulting K-intercalated graphite with alcohol, producing violently exfoliated graphite containing NGPs. The process must be carefully conducted in a vacuum or an extremely dry glove box environment since pure alkali metals, such as potassium and sodium, are extremely sensitive to moisture and pose an explosion danger. This process is not amenable to the mass production of NGPs. The present invention was made to overcome the limitations outlined above.

Approach 3: Epitaxial Growth and Chemical Vapor Deposition of Graphene on Inorganic Crystal Surfaces Small-scale production of ultra-thin graphene sheets on a substrate can be obtained by thermal decomposition-based epitaxial growth and a laser desorption-ionization technique. [Walt A. DeHeer, Claire Berger, Phillip N. First, "Patterned thin film graphite devices and method for making same" U.S. Pat. No. 7,327,000 B2 (Jun. 12, 2003)] Epitaxial films of graphite with only one or a few atomic layers are of technological and scientific significance due to their peculiar characteristics and great potential as a device substrate. However, these processes are not suitable for mass production of isolated graphene sheets for composite materials and energy storage applications.

Approach 4: The Bottom-Up Approach (Synthesis of Graphene from Small Molecules)

Yang, et al. ["Two-dimensional Graphene Nano-ribbons," J. Am. Chem. Soc. 130 (2008) 4216-17] synthesized nano graphene sheets with lengths of up to 12 nm using a method that began with Suzuki-Miyaura coupling of 1,4-diiodo-2,3,5,6-tetraphenyl-benzene (DITB) with 4-bromophenylboronic acid (BBA). The resulting hexaphenylbenzene derivative was further derivatized and ring-fused into small graphene sheets. This is a slow process that thus far has produced very small graphene sheets. This approach has extremely limited scope of application—only coupling between DITB and BBA works. No other chemical species were found to follow this synthesis route. The present invention was made to overcome the limitations outlined above.

Hence, an urgent need exists for a graphene production process that requires a reduced amount of undesirable chemical (or elimination of these chemicals all together), shortened process time, less energy consumption, lower degree of graphene oxidation, reduced or eliminated effluents of undesirable chemical species into the drainage (e.g., sulfuric acid) or into the air (e.g., $SO_2$ and $NO_2$). The process should be able to produce more pristine (less oxidized and damaged), more electrically conductive, and larger/wider graphene sheets.

SUMMARY OF THE INVENTION

The present invention provides a strikingly simple, fast, scalable, environmentally benign, and cost-effective process or method that meets the afore-mentioned needs. This method is capable of producing single-layer or few layer graphene directly from a precursor to carbon or graphite (referred to as a carbon/graphite precursor). In certain embodiments, the invented method disrupts, interrupts, and/or stops the graphitization or even carbonization procedures of highly aromatic molecules or polycyclic aromatic hydrocarbons.

In some embodiments, the invention provides a method of producing isolated graphene sheets (directly from a graphite precursor). This method comprises: (a) providing a mass of aromatic molecules in a liquid, solid, or semi-solid state wherein the aromatic molecules are selected from petroleum heavy oil or pitch, coal tar pitch, a polynuclear hydrocarbon, or a combination thereof; (b) heat treating this mass of aromatic molecules and using chemical or mechanical means to form graphene domains dispersed in a disordered matrix of carbon or hydrocarbon molecules, wherein the graphene domains are each composed of from 1 to 30 20 μm (more typically 10 nm to 10 μm) and, in the situations wherein there are 2-30 planes in a graphene domain, an inter-graphene space between two planes of hexagonal carbon atoms or fused aromatic rings no less than 0.4 nm; and (c) separating and isolating the planes of hexagonal carbon atoms or fused aromatic rings to recover graphene sheets from the disordered matrix. In certain situations, the graphene domains can contain up to 40 graphene planes (e.g. when the final heat treatment temperature is relatively high, >1,500° C.), but preferably and typically up to 20 planes only. During the recovery process, graphene domains having up to 30 graphene planes can be separated into graphene platelets having less than 10 graphene planes per platelet; e.g. if under ultrasonication or high shear (typically having a shear rate from 1 to 5,000 $sec^{-1}$). These mechanical treatments may be applied to the mass of PAHs not only during heat treatments, but also during the subsequent isolation (e.g. solvent extraction) procedure.

Preferably, the polynuclear hydrocarbon is selected from naphthalene, anthracene, phenanthrene, tetracene, chrysene, triphenylene, pyrene, pentacene, benzo-pyrene, corannulene, benzo-perylene, coronene, ovalene, benzo-fluorene, a derivative thereof having a substituent on a ring structure thereof, a chemical derivative thereof, or a combination thereof.

The heat treatments serve to chemically transform the aromatic molecules (pitches or polynuclear hydrocarbon molecules) into "graphene domains" dispersed in or connected to a disordered matrix of carbon or hydrocarbon molecules. The matrix is characterized by having amorphous and defected areas of carbon or hydrocarbon molecules. These graphene domains (yet to be isolated or separated) can include individual single planes of hexagonally arranged carbon atoms ("graphene planes") or multiple graphene planes (2-20 hexagonal carbon planes stacked together) that are embedded in or connected to disordered or defected areas of carbon or hydrocarbon molecules, which can contain other atoms (such as N, S, etc.) than C, O, and H.

Typically, the graphene domains formed during the heat treatment have a length or width from 10 nm to 10 μm or an inter-graphene space no less than 0.5 nm. In certain embodiments, the graphene domains have an inter-graphene space from 0.5 nm to 2.0 nm. In some embodiments, the graphene domains have a length or width from 15 nm to 2 μm.

The recovered graphene sheets typically comprise single-layer graphene, double-layer graphene, or triple-layer graphene sheets. In many cases, the graphene sheets produced contain at least 80% single-layer graphene or at least 80% few-layer graphene having no greater than 10 graphene planes.

The graphene sheets produced by using the presently invented method can contain pristine graphene, oxidized graphene with less than 5% oxygen content by weight, graphene fluoride, graphene fluoride with less than 5% fluorine by weight, graphene with a carbon content no less than 95% by weight, or chemically modified graphene.

In the invented method, the heat treatment is typically conducted at a temperature selected from a range of 150° C. to 3,200° C., preferably from 200° C. to 2,500° C., more preferably from 300° C. to 1,500° C., and most preferably from 400° C. to 1,200° C.

In the invented method, chemical means and/or mechanical means are found to be surprisingly effective in promoting more uniform dispersion of individual graphene planes (for reduced stacking of graphene planes along the plane thickness direction) and in preventing close stacking (compacting) of graphene planes in the graphene domains along the thickness direction, if/when stacking of several graphene planes occurs.

The chemical means include functionalizing or derivatizing at least one of the planes of hexagonal carbon atoms or fused aromatic rings. These planes are incipient of or precursor to graphene planes. Chemical functional groups at the edge or on the plane surface of such incipient planes prevent close stacking of these planes.

The mechanical means include exposing said mass of aromatic molecules to a gaseous environment, flowing fluid, sonic waves, mechanical shearing, or a combination thereof. The mechanical means serve to randomize the dispersion and orientation of graphene planes in the mass of aromatic molecules being heat-treated.

In certain embodiments, the step of separating and isolating graphene sheets includes solvent extraction or supercritical fluid extraction of the planes of hexagonal carbon atoms or fused aromatic rings from the disordered matrix to form the graphene sheets. The supercritical fluid may include carbon dioxide.

In certain embodiments, step (c) includes an operation of dissolving, melting, etching, vaporizing, subliming, burning off, or ultrasonicating the disordered matrix material for separating the graphene sheets.

Another surprising and highly advantageous feature of the presently invented process is the notion that graphene sheet production and chemical functionalization can be accomplished concurrently. Desired functional groups can be imparted to graphene edges and/or surfaces, provided that selected chemical species (functionalizing agents) containing desired chemical function groups (e.g. —NH$_2$, Br—, etc.) are dispersed or dissolved in the reacting mass of aromatic molecules being heat-treated. Chemical functionalization reactions can occur in situ as soon as the reactive sites or active radicals are formed.

In some embodiments, functionalizing agents contain a chemical functional group selected from alkyl or aryl silane, alkyl or aralkyl group, hydroxyl group, carboxyl group, amine group, sulfonate group (—SO$_3$H), aldehydic group, quinoidal, fluorocarbon, or a combination thereof.

In certain embodiments, the functionalizing agent contains an azide compound selected from the group consisting of 2-Azidoethanol, 3-Azidopropan-1-amine, 4-(2-Azidoethoxy)-4-oxobutanoic acid, 2-Azidoethyl-2-bromo-2-methyl-propanoate, chlorocarbonate, azidocarbonate, dichlorocarbene, carbene, aryne, nitrene, (R-)-oxycarbonyl nitrenes, where R=any one of the following groups,

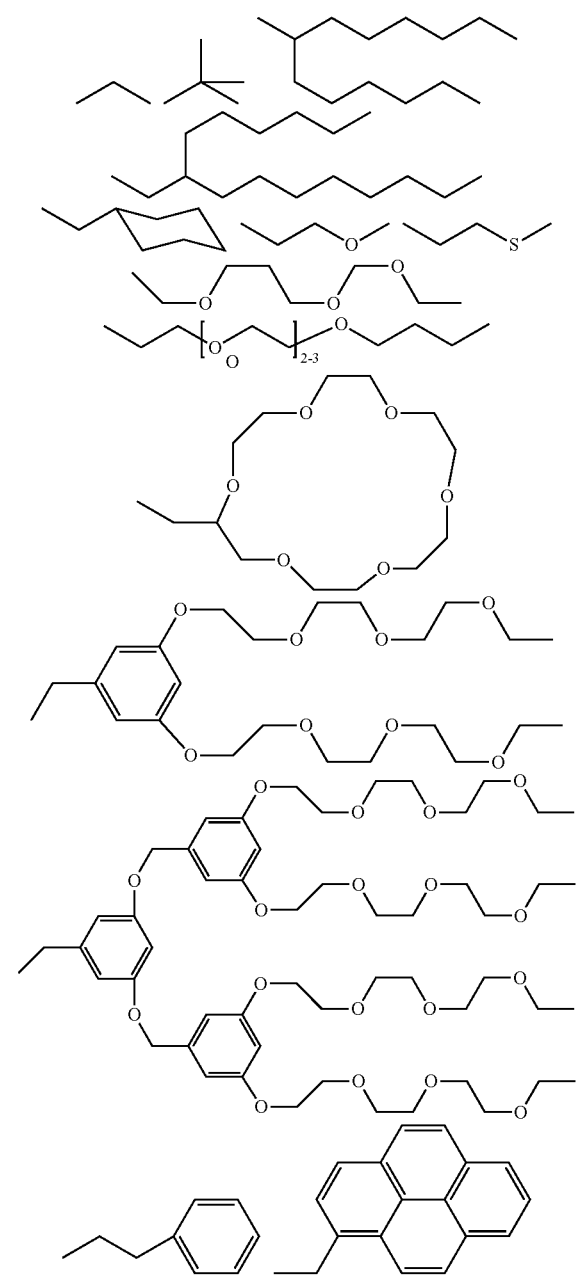

and combinations thereof.

In certain embodiments, the functionalizing agent contains an oxygenated group selected from the group consisting of hydroxyl, peroxide, ether, keto, and aldehyde. In certain embodiments, the functionalizing agent contains a functional group selected from the group consisting of $SO_3H$, COOH, $NH_2$, OH, R'CHOH, CHO, CN, COCl, halide, COSH, SH, COOR', SR', $SiR'_3$, $Si(-O-)^yR'_{3-y}$, $Si(-O-SiR'_2-)OR'$, R", Li, $AlR'_2$, Hg—X, $TlZ_2$ and Mg—X; wherein y is an integer equal to or less than 3, R' is hydrogen, alkyl, aryl, cycloalkyl, or aralkyl, cycloaryl, or poly(alkylether), R" is fluoroalkyl, fluoroaryl, fluorocycloalkyl, fluoroaralkyl or cycloaryl, X is halide, and Z is carboxylate or trifluoroacetate, and combinations thereof.

The functionalizing agent may contain a functional group selected from the group consisting of amidoamines, polyamides, aliphatic amines, modified aliphatic amines, cycloaliphatic amines, aromatic amines, anhydrides, ketimines, diethylenetriamine (DETA), triethylene-tetramine (TETA), tetraethylene-pentamine (TEPA), polyethylene polyamine, polyamine epoxy adduct, phenolic hardener, non-brominated curing agent, non-amine curatives, and combinations thereof. The functionalizing agent may contain an acrylonitrile chain, polyfurfuryl alcohol, phenolic resin, or a combination thereof.

In some embodiments, the functionalizing agent contains a functional group selected from OY, NHY, O=C—OY, P=C—NR'Y, O=C—SY, O=C—Y, —CR'1-OY, N'Y or C'Y, and Y is a functional group of a protein, a peptide, an amino acid, an enzyme, an antibody, a nucleotide, an oligonucleotide, an antigen, or an enzyme substrate, enzyme inhibitor or the transition state analog of an enzyme substrate or is selected from R'—OH, R'—$NR'_2$, R'SH, R'CHO, R'CN, R'X, $R'N^+(R')_3X^-$, $R'SiR'_3$, $R'Si(-OR'-)_yR'_{3-y}R'Si(-O-SiR'_2-)OR'$, R'—R", R'—N—CO, $(C_2H_4O-)_wH$, $(-C_3H_6O-)_wH$, $(-C_2H_4O)_w-R'$, $(C_3H_6O)_w-R'$, R', and w is an integer greater than one and less than 200.

In certain embodiments of the present invention, the method of producing isolated graphene sheets from a graphite precursor comprises: (A) providing a mass of aromatic molecules in a liquid, solid, or semi-solid state wherein the aromatic molecules are selected from petroleum heavy oil or pitch, coal tar pitch, a polynuclear hydrocarbon, or a combination thereof; (B) heat treating the mass of aromatic molecules to form graphene domains dispersed in a disordered matrix of carbon or hydrocarbon molecules, wherein the graphene domains are each composed of one or a plurality of planes of hexagonal carbon atoms or fused aromatic rings having a length or width from 5 nm to 10 μm; and (C) separating and isolating the planes of hexagonal carbon atoms or fused aromatic rings to recover graphene sheets from the disordered matrix. The polynuclear hydrocarbon is selected from naphthalene, anthracene, phenanthrene, tetracene, chrysene, triphenylene, pyrene, pentacene, benzo-pyrene, corannulene, benzo-perylene, coronene, ovalene, benzo-fluorene, a derivative thereof having a substituent on a ring structure thereof, a chemical derivative thereof, or a combination thereof.

In this method, no chemical means or mechanical means was used to regulate the clustering and stacking of graphene planes during the initiation and growth of graphene planes or domains. Consequently, the resulting graphene sheets tend to have more layers or thicker.

DETAILED DESCRIPTION OF PREFERRED EMBODIMENTS

Figure 1:
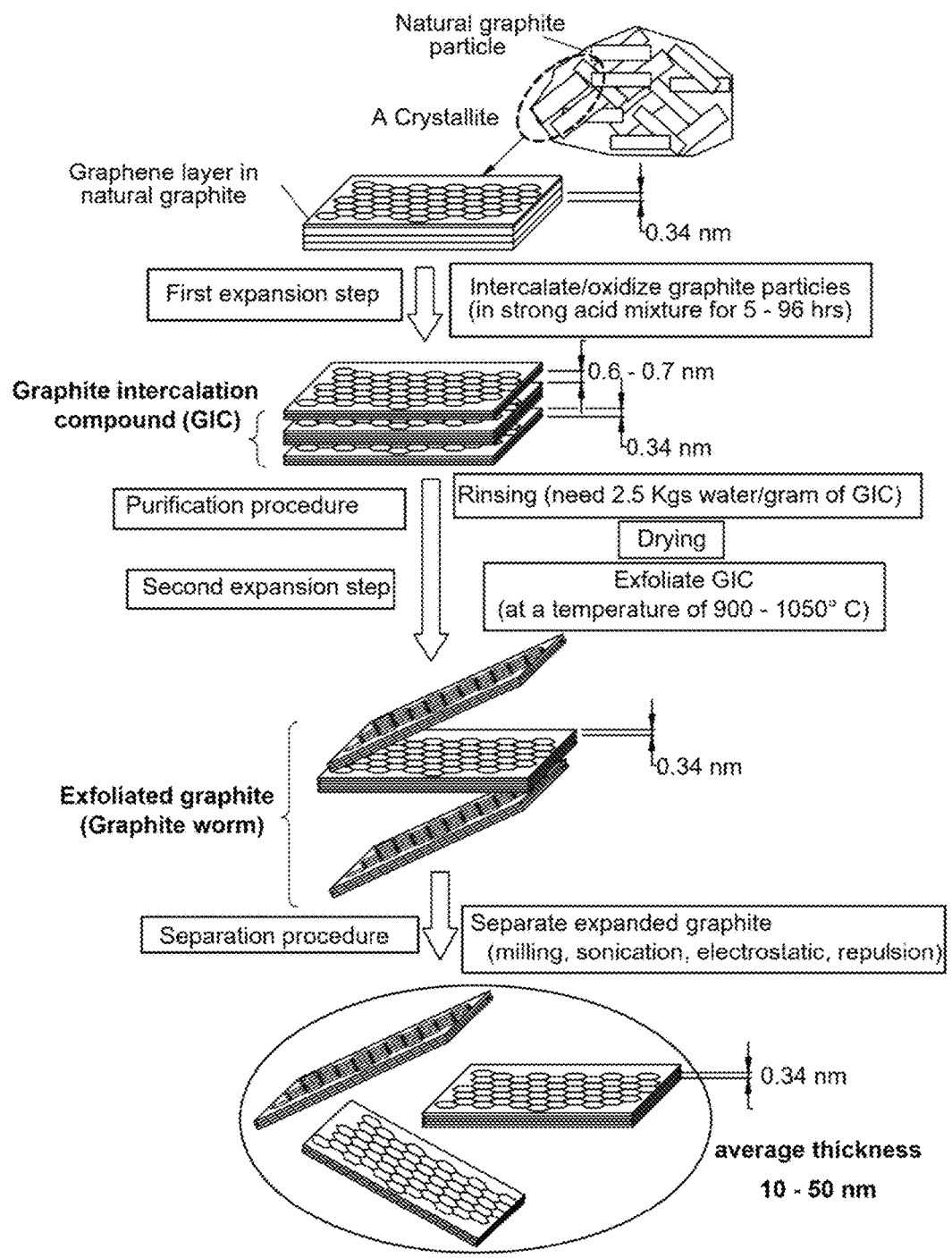
FIG. 1 A flow chart showing the most commonly used prior art process of producing highly oxidized NGPs that entails tedious chemical oxidation/intercalation, rinsing, and high-temperature exfoliation procedures.

Carbon materials can assume an essentially amorphous structure (glassy carbon), a highly organized crystal (graphite), or a wide range of intermediate structures that are characterized in that various proportions and sizes of graphite crystallites and defects are dispersed in an amorphous carbon matrix. Typically, a graphite crystallite is composed of multiple graphene planes (planes of hexagonal structured carbon atoms or basal planes) that are bonded together through van der Waals forces in the c-axis direction, the direction perpendicular to the basal plane. These graphite crystallites are typically micron- or nanometer-sized. The graphite crystallites are dispersed in or connected by crystal defects or an amorphous phase in a graphite particle, which can be a natural graphite flake, artificial graphite bead, carbon/graphite fiber segment, carbon/graphite whisker, or carbon/graphite nanofiber.

One embodiment of the present invention is a method of producing isolated/separated graphene sheets or nano graphene platelet (NGP). A NGP is essentially composed of a graphene plane (hexagonal lattice of carbon atoms) or multiple graphene planes stacked and bonded together (typically up to 10 graphene planes per multi-layer platelet). Each graphene plane, also referred to as a graphene sheet, comprises a two-dimensional hexagonal structure of carbon atoms. Each platelet has a length and a width parallel to the graphene plane and a thickness orthogonal to the graphene plane. By definition, the thickness of an NGP can be 100 nanometers (nm) or smaller (preferably containing no greater than 10 hexagonal planes), with a single-sheet NGP, also referred to as single-layer graphene, being as thin as 0.34 nm.

Currently, the most commonly used method of graphene production is the so-called chemical method, referred to in the Background section as "Approach 1: Chemical Formation and Reduction." This method entails chemical intercalation or oxidation of natural graphite or synthetic graphite particles. These particles are essentially already in the fully graphitized state. Prior to intercalation or oxidation, the graphite particle has an inter-graphene plane spacing as small as approximately 0.335 nm ($L_d=\frac{1}{2}d_{002}=0.335$ nm). Due to the short-range force nature of van der Waals forces, the bonding between graphene planes is very strong, making it difficult for any chemical species to intercalate into the inter-graphene spaces. Hence, it normally takes a combination of a strong acid (e.g. sulfuric acid) and a strong oxidant (e.g. potassium permanganate or nitic acid) and a long reaction time to achieve full chemical intercalation or oxidation of graphite to produce the graphite intercalation compound (GIC) or graphite oxide (GO). With an intercalation and oxidation treatment, the inter-graphene spacing is increased to a value typically greater than 0.6 nm. This is the first expansion stage experienced by the graphite material during this chemical route. The obtained GIC or GO is then subjected to further expansion (often referred to as exfoliation) using either a thermal shock exposure or a solution-based, ultrasonication-assisted graphene layer exfoliation approach.

Figure 4A:
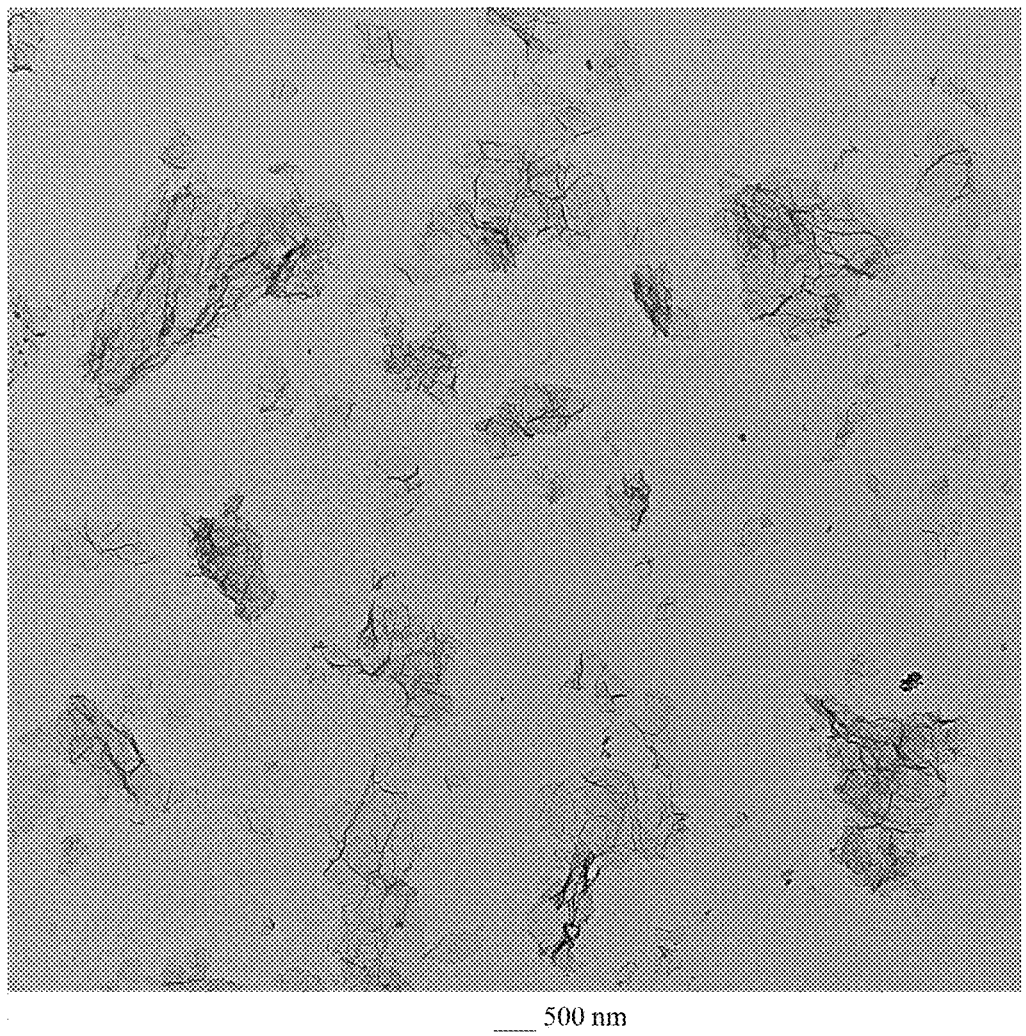
FIG. 4(A) Transmission electron micrograph of graphene sheets produced by conventional Hummer's route from graphite (much smaller graphene sheets, but comparable thickness).

In the thermal shock exposure approach, the GIC or GO is exposed to a high temperature (typically 800-1,050° C.) for a short period of time (typically 15 to 60 seconds) to exfoliate or expand the GIC or GO for the formation of exfoliated or further expanded graphite, which is typically in the form of a "graphite worm" composed of graphite flakes that are still interconnected with one another. This thermal shock procedure can produce some separated graphite flakes or graphene sheets, but normally the majority of graphite flakes remain interconnected. Typically, the exfoliated graphite or graphite worm is then subjected to a flake separation treatment using air milling, mechanical shearing, or ultrasonication in water to produce graphene sheets (e.g. FIG. 4A).

As such, this prior art Approach 1 basically entails three distinct procedures: first expansion (oxidation or intercalation), further expansion (or "exfoliation"), and separation. As stated in the Background section, this approach has 7 major deficiencies: (a) the process requires the use of large quantities of several undesirable chemicals; (b) the chemical treatment process requires a long intercalation and oxidation time; (c) strong acids consume a significant amount of starting graphite material; (d) the process is a highly energy-intensive process; (e) the approach requires a very tedious washing and purification step; (f) the resulting products are GO platelets that must undergo a further chemical or thermal reduction treatment to reduce the oxygen content; and (g) the process can induce negative environmental impact.

The present invention provides a brand-new method of producing graphene sheets (single-layer or few layer graphene having 1-10 layers) from aromatic molecules without forming a graphite (no conventional carbonization and no graphitization treatments). This strikingly simple and elegant process avoids all the afore-mentioned 7 problems associated with the chemical method of graphene production.

Figure 3:
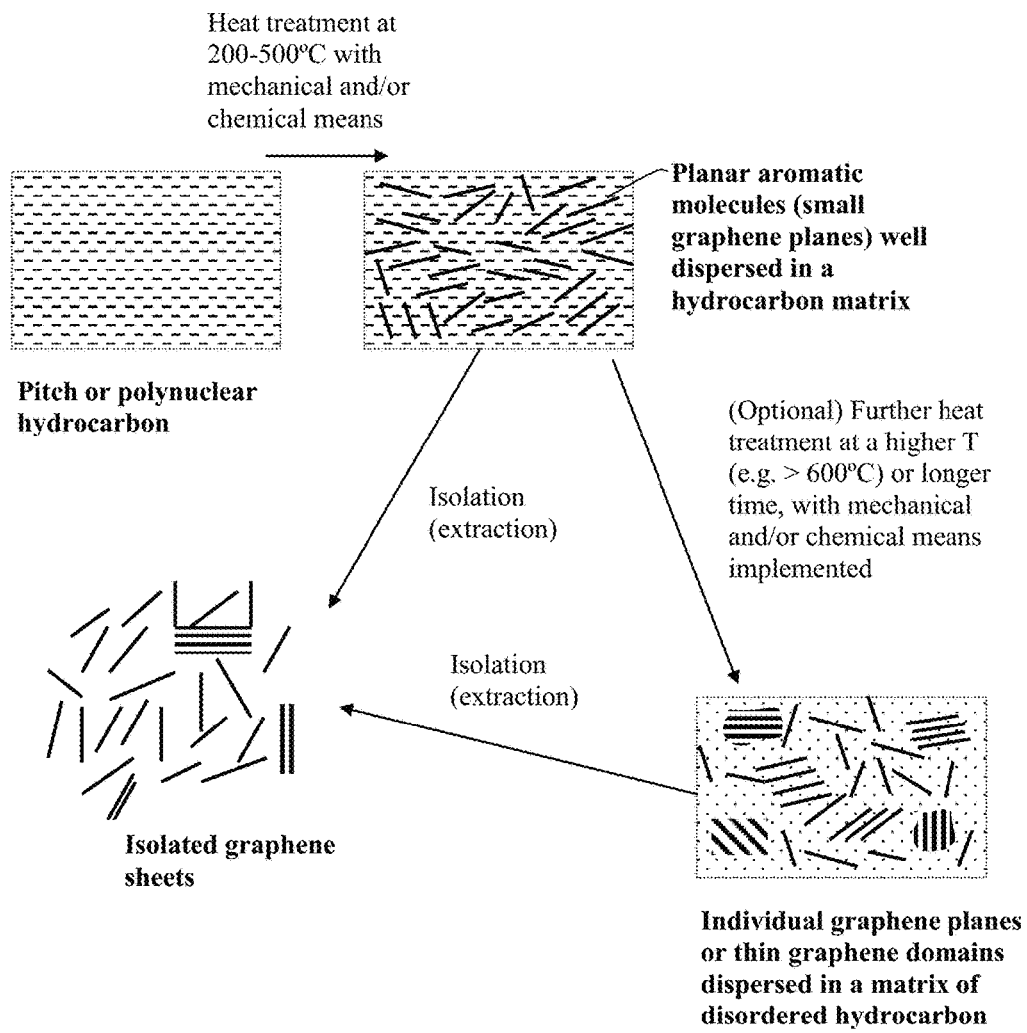
FIG. 3 A flow chart showing the presently invented process for producing isolated graphene sheets directly from graphite precursor.

In certain preferred embodiments, as illustrated in FIG. 3, the invented method of producing isolated graphene sheets (directly from a graphite precursor) comprises: (a) providing a mass of aromatic molecules in a liquid, solid, or semi-solid state wherein the aromatic molecules are selected from petroleum heavy oil or pitch, coal tar pitch, a polynuclear hydrocarbon, or a combination thereof; (b) heat treating this mass of aromatic molecules and using chemical or mechanical means to form graphene domains dispersed in a disordered matrix of carbon or hydrocarbon molecules, wherein the graphene domains are each composed of from 1 to 30 planes of hexagonal carbon atoms or fused aromatic rings having a length or width from 5 nm to 10 μm and, in the situations wherein there are 2-30 planes in a graphene domain, an inter-graphene space between two planes of hexagonal carbon atoms or fused aromatic rings no less than 0.4 nm (typically from 0.5 nm to 2.0 nm); and (c) separating and isolating the planes of hexagonal carbon atoms or fused aromatic rings to recover graphene sheets from the disordered matrix.

Figure 4B:
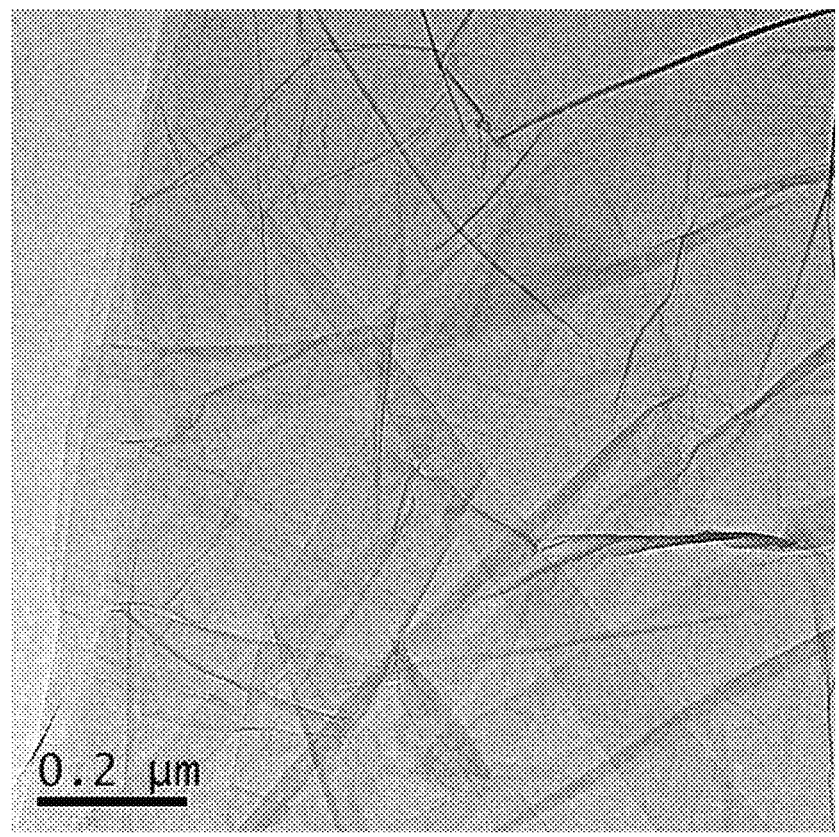
FIG. 4(B) Transmission electron micrograph of graphene sheets produced by the presently invented method (several single-layer graphene sheets overlapped together).

The graphene sheets or NGPs produced with the instant method are mostly single-layer graphene (in some cases, with some few-layer graphene sheets (up to 10 layers). The length and width of a NGP are typically from 5 nm to 20 μm, but more typically from 10 nm to 10 μm, and most typically from 20 nm to 2 μm. FIG. 4(B) gives a TEM image of some of the single-layer graphene sheets produced using the presently invented method. These graphene sheets are typically longer and wider than those produced by the conventional Hummer's method (e.g. FIG. 4(A)).

Polynuclear hydrocarbons (also referred to as polycyclic aromatic hydrocarbons, PAHs, polyaromatic hydrocarbons, or polynuclear aromatic hydrocarbons) are hydrocarbons (organic compounds containing mostly carbon and hydrogen) that are composed of multiple aromatic rings (organic rings in which the electrons are delocalized). Herein, PAHs include those having further branching substituents on these ring structures. The simplest of such chemicals are naphthalene, having two aromatic rings, and the three-ring compounds anthracene and phenanthrene. Briefly, examples of PAHs are naphthalene, anthracene, phenanthrene, tetracene, chrysene, triphenylene, pyrene, pentacene, benzo-pyrene, corannulene, benzo-perylene, coronene, ovalene, and benzo-fluorene. PAHs of interest here typically have from 2 to 20 aromatic rings (approximately 10 to 60 carbon atoms) fused together, more typically from 2 to 10 rings (approximately 10 to 32 carbon atoms).

Petroleum- or coal-derived pitch is a mixture of larger polynuclear hydrocarbons with an average molecular weight of approximately 200 amu (approximately 180-200 carbon atoms or 60-66 rings). Each pitch product is a mixture of many different types and sizes of polynuclear hydrocarbons. There are also a variety of impurities (1-10% by weight) in such pitch materials. In contrast, those PAHs mentioned above are substantially impurity-free.

In some embodiments, the invented method begins with heat-treating a high-purity (>99%) polycyclic aromatic hydrocarbon (PAH) or a mixture of several pure PAHs at a temperature selected from the range of 150° C. to 1,500° C., more preferably from 200° C. to 1,200° C., and further preferably from 300° C. to 1,000° C. In some preferred embodiments, the heat treatments include a first heat treatment temperature preferably in the range of 150° C. to 300° C. for a heat treatment time of preferably 0.2 to 24 hours. This is followed by a second heat treatment at a second temperature from 300° C. to 1,500° C. for preferably 0.2 to 24 hours.

At the first heat treatment temperature of 150° C. to 300° C., the PAHs can undergo dehydrogenation polymerization that entails removal of non-carbon atoms, such as H and N, and lateral merging of fused aromatic rings to form longer and wider aromatic molecules (polyaromatic molecules) or more aromatic rings fused together in the length and width directions, much like growing polymer chains. Such a structure of fused aromatic rings can grow to contain up to 300 carbon atoms or approximately 100 rings fused together. Such a structure is an incipient graphene sheet.

At a second heat treatment temperature selected from 300° C. to 1,500° C., these incipient graphene sheets continue to grow in lateral dimensions (length and width), which can reach several micrometers and the resulting graphene sheets can each contain may thousands of fused rings. These dimensions and number of fused rings can be determined by using transmission electron microscopy (TEM) and atomic force microscopy (AFM).

As the polyaromatic molecules grow at a heat treatment temperature, the cohesive energy between polyaromatic molecules can eventually exceed the translational energy of individual polyaromatic molecules, resulting in the homogeneous nucleation of a new phase, called the mesophase. The polyaromatic molecules that constitute the mesophase are discotic, with one axis much smaller than the other two axes. These planar molecules can arrange themselves with the planes parallel to each other, forming nematic liquid crystals. The growing liquid crystal phase adopts a spherical shape to minimize surface energy. Thus, the mesophase creates microbeads, which could have diameters up to 100 μm.

Figure 2:
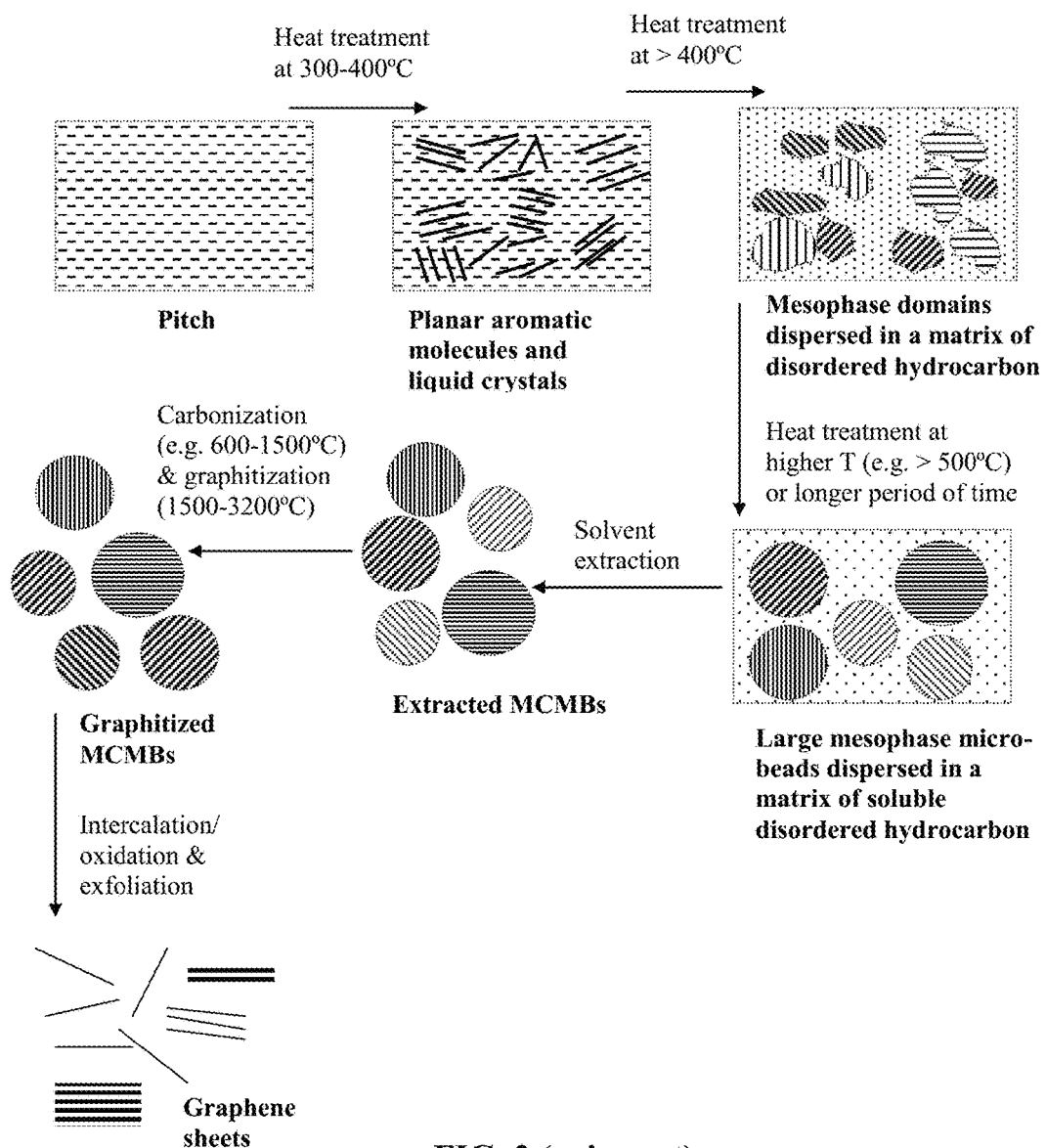
FIG. 2 A flow chart showing a prior art process that entails heat-treating petroleum or coal tar pitch at 300-400° C. to produce planar aromatic molecules, heating the planar aromatic molecules at >400° C. to produce mesophase domains, further heating to produce mesophase spheres dispersed in a disordered hydrocarbon matrix, extracting the mesophase spheres to produce extracted mesocarbon micro-beads (extracted MCMBs or "green" MCMBs), carbonizing and graphitizing extracted MCMBs to produce (graphitized) MCMBs, chemically intercalating or oxidizing MCMBs to produce GIC or GO, thermally or mechanically exfoliate GIC or GO to produce graphite worms, and mechanically shearing the graphite worms to produce isolated graphene sheets.

FIG. 2 shows a prior art process that entails heat-treating petroleum or coal tar pitch at 300-400° C. to produce planar aromatic molecules, heating the planar aromatic molecules at >400° C. to produce mesophase domains, further heating to produce mesophase spheres dispersed in a disordered hydrocarbon matrix, extracting the mesophase spheres to produce extracted mesocarbon micro-beads (extracted or "green" MCMBs), carbonizing and graphitizing extracted MCMBs to produce (graphitized) MCMBs, chemically intercalating or oxidizing MCMBs to produce GIC or GO, thermally or mechanically exfoliate GIC or GO to produce graphite worms, and mechanically shearing the graphite worms to produce isolated graphene sheets. This is again a tedious, energy intensive, and chemical intensive process.

After extensive and in-depth studies, we have come to observe that surprisingly the formation of mesophase crystals or micro-beads can be interrupted or disrupted by using selected mechanical means and/or chemical means. In the invented method, chemical means and/or mechanical means are effective in promoting more uniform dispersion of individual graphene planes (for reduced aggregating and reduced stacking of graphene planes along the plane thickness direction) and in preventing close stacking (compacting) of graphene planes in the graphene domains along the thickness direction, if/when stacking of multiple graphene planes occurs. Without the mechanical means and chemical means, the inter-graphene spacing in graphene domains is typically much smaller than 0.4 nm. With the mechanical or chemical means being implemented during the heat treatments, the inter-graphene spacing in graphene domains (if present) is typically greater than 0.4 nm, more typically from 0.5 nm to 2.3 nm, and most typically from 0.6 nm to 1.5 nm. Reduced aggregation (clustering) and reduced close-stacking of graphene planes in a hydrocarbon mass would make it easier to isolate and recover individual graphene sheets from a matrix of other chemical species.

The chemical means include functionalizing or derivatizing at least one of the planes of hexagonal carbon atoms or fused aromatic rings. These planes are incipient or precursor to graphene planes. Chemical functional groups at the edge or on a plane surface of such incipient planes prevent close stacking of these planes.

The mechanical means include exposing the mass of aromatic molecules to a gaseous environment, flowing fluid, sonic waves, mechanical shearing, or a combination thereof. The mechanical means serve to randomize the dispersion and orientation of graphene planes in the mass of aromatic molecules being heat-treated. These actions interrupt or disrupt the aggregation and close stacking of graphene planes, reducing the number of graphene planes in a graphene domain (if present) to be less than 20 (typically less than 10 and more typically 1-5 planes). Consequently, the subsequent extraction or isolation means produce most single-layer or few-layer graphene sheets.

In certain embodiments, the invented process begins with a petroleum pitch or coal tar pitch. Upon heating to approximately 200° C., pitch becomes fluid or gets melted. In the melt, the translational energy afforded to molecules by the temperature overcomes the cohesion energy. However, at a higher temperature (e.g., >300° C.), dehydrogenation polymerization reactions occur, causing average molecular weight to increase, which can reach 600-900 amu (approximately 200-300 rings fused together) when the temperature exceeds 400° C.

As the molecules grow, without external disturbance, the cohesive energy exceeds the translational energy, resulting in the homogeneous nucleation of a mesophase. The polyaromatic molecules that constitute the mesophase pitch are discotic, with one axis much smaller than the other two axes. Again, these molecules can arrange themselves with the planes parallel to each other, forming nematic liquid crystals. The growing liquid crystal phase adopts a spherical shape to minimize surface energy. Thus, the mesophase creates microbeads, which could grow to have diameters up to 100 μm.

Again, we have found that mechanical means and chemical means can disrupt/interrupt the measophase crystal- or microbead-forming process. As a result, we can more easily and readily isolate/recover individual graphene sheets or thin graphene domains (having less than 10 graphene planes) from the matrix of disordered hydrocarbon material.

In graphite industry, the microbead-producing process begins with utilization of petroleum heavy oil pitch, coal tar pitch, or oil sand. When the pitch is carbonized by a heat treatment at 400 to 500° C., micro-crystals called mesophase micro-spheres are formed in the heat-treated pitch. These mesophase micro-spheres are liquid crystals having a characteristic molecular arrangement that can be converted into highly crystalline carbonized products by subjecting them to a further heat treatment. These mesophase micro-spheres (typically insoluble), after being isolated from other (soluble) components of the heat-treated pitch, are often referred to as mesocarbon microbeads (MCMB), mesophase carbon spheres (MCS), or carbonaceous micro-spheres (CMS). The presently invented mechanical means or chemical means disrupt the formation of MCMBs.

Several methods have been used for isolation of individual graphene planes or graphene domains from other components in a heat-treated mass of PAHs or pitch. These include solvent extraction, emulsification, centrifugal separation, and pressurized filtration. Using solvent extraction as an example, the heat treated mass containing these graphene sheets or domains may be first selectively dissolved in quinoline, pyridine, or an aromatic oil such as anthracene oil, solvent naptha, or the like, with the graphene sheets or graphene domains being suspended as an insoluble component. The insoluble component in the resulting suspension is then isolated by solid-liquid separation to become isolated single-layer graphene sheets or few-layer graphene sheets.

As shown in FIG. 1, the prior art chemical processes of producing graphene (reduced graphene oxide) from natural graphite typically involve immersing graphite powder in a mixture of concentrated sulfuric acid, nitric acid, and an oxidizer, such as potassium permanganate or sodium perchlorate, forming a reacting mass that requires typically 5-120 hours to complete the chemical intercalation/oxidation reaction. Once the reaction is completed, the slurry is subjected to repeated steps of rinsing and washing with water and then subjected to drying treatments to remove water. The dried powder, referred to as graphite intercalation compound (GIC) or graphite oxide (GO), is then subjected to a thermal shock treatment. This can be accomplished by placing GIC in a furnace pre-set at a temperature of typically 800-1100° C. (more typically 950-1050° C.). The resulting products are typically highly oxidized graphene (i.e. graphene oxide with a high oxygen content), which must be chemically or thermal reduced to obtain reduced graphene oxide (RGO). RGO is found to contain a high defect population and, hence, is not as conducting as pristine graphene. We have observed that that the pristine graphene paper (prepared by vacuum-assisted filtration of pristine graphene sheets) exhibit electrical conductivity values in the range of 1,500-4,500 S/cm. In contrast, the RGO paper prepared by the same paper-making procedure typically exhibits electrical conductivity values in the range of 100-1,000 S/cm.

It is again critically important to recognize that the impacting process not only avoids significant chemical usage, but also produces a higher quality final product—pristine graphene as opposes to thermally reduced graphene oxide, as produced by the prior art process. Pristine graphene enables the creation of materials with higher electrical and thermal conductivity.

The revolutionary process of the present invention appears to essentially eliminate the required functions of graphene plane expansion, intercalant penetration, exfoliation, and separation of graphene sheets and replace it with an entirely mechanical exfoliation process. The entire process can take less than 5 hours, and can be done with no added chemicals. This is absolutely stunning, a shocking surprise to even those top scientists and engineers or those of extraordinary ability in the art.

The presently invented process is capable of producing single-layer graphene sheets. In many examples, the graphene material produced contains at least 80% single-layer graphene sheets. The graphene produced can contain pristine graphene, oxidized graphene with less than 5% oxygen content by weight, graphene fluoride, graphene oxide with less than 5% fluorine by weight, graphene with a carbon content no less than 95% by weight, or functionalized graphene.

The presently invented process does not involve the production of GIC and, hence, does not require the exfoliation of GIC at a high exfoliation temperature (e.g. 800-1,100° C.). This is another major advantage from environmental protection perspective. The prior art processes require the preparation of dried GICs containing sulfuric acid and nitric acid intentionally implemented in the inter-graphene spaces and, hence, necessarily involve the decomposition of $H_2SO_4$ and $HNO_3$ to produce volatile gases (e.g. $NO_x$ and $SO_x$) that are highly regulated environmental hazards. The presently invented process completely obviates the need to decompose $H_2SO_4$ and $HNO_3$ and, hence, is environmentally benign. No undesirable gases are released into the atmosphere during the combined graphite expansion/exfoliation/separation process of the present invention.

Chemical means are herein discussed in more detail. The carbon atoms at the edge planes of PAHs are reactive and must contain some heteroatom or group to satisfy carbon valency. Provided that certain chemical species, containing desired chemical function groups (e.g. —$NH_2$, Br—, etc.), are included in the heat-treated mass of PAHs or pitch, these functional groups can be imparted to graphene edges and/or surfaces. In other words, production and chemical functionalization of graphene sheets can be accomplished concurrently by including appropriate chemical compounds in the heat-treatment mass. In summary, a major advantage of the present invention over other processes is the simplicity of simultaneous production and modification of surface chemistry.

Graphene platelets derived by this process may be functionalized through the inclusion of various chemical species in the heat-treatment mass. In each group of chemical species discussed below, we selected 2 or 3 chemical species for functionalization studies.

In one preferred group of chemical agents, the resulting functionalized NGP may broadly have the following formula(e): [NGP]—$R_m$, wherein m is the number of different functional group types (typically between 1 and 5), R is selected from $SO_3H$, COOH, $NH_2$, OH, R'CHOH, CHO, CN, COCl, halide, COSH, SH, COOR', SR', $SiR'_3$, Si(—OR'—$)_yR'_3$-y, Si(—O—$SiR'_2$—)OR', R", Li, $AlR'_2$, Hg—X, $TlZ_2$ and Mg—X; wherein y is an integer equal to or less than 3, R' is hydrogen, alkyl, aryl, cycloalkyl, or aralkyl, cycloaryl, or poly(alkylether), R" is fluoroalkyl, fluoroaryl, fluorocycloalkyl, fluoroaralkyl or cycloaryl, X is halide, and Z is carboxylate or trifluoroacetate.

For NGPs to be effective reinforcement fillers in epoxy resin, the function group —$NH_2$ is of particular interest. For example, a commonly used curing agent for epoxy resin is diethylenetriamine (DETA), which has three —$NH_2$ groups. If DETA is included in the impacting chamber, one of the three —$NH_2$ groups may be bonded to the edge or surface of a graphene sheet and the remaining two un-reacted —$NH_2$ groups will be available for reacting with epoxy resin later. Such an arrangement provides a good interfacial bonding between the NGP (graphene sheets) and the matrix resin of a composite material.

Other useful chemical functional groups or reactive molecules may be selected from the group consisting of amidoamines, polyamides, aliphatic amines, modified aliphatic amines, cycloaliphatic amines, aromatic amines, anhydrides, ketimines, diethylenetriamine (DETA), triethylene-tetramine (TETA), tetraethylene-pentamine (TEPA), hexamethylenetetramine, polyethylene polyamine, polyamine epoxy adduct, phenolic hardener, non-brominated curing agent, non-amine curatives, and combinations thereof. These functional groups are multi-functional, with the capability of reacting with at least two chemical species from at least two ends. Most importantly, they are capable of bonding to the edge or surface of graphene using one of their ends and, during subsequent epoxy curing stage, are able to react with epoxide or epoxy resin at one or two other ends.

The above-described [NGP]—$R_m$ may be further functionalized. This can be conducted by opening up the lid of an impacting chamber after the —$R_m$ groups have been attached to graphene sheets and then adding the new functionalizing agents to the impacting chamber and resuming the impacting operation. The resulting graphene sheets or platelets include compositions of the formula: [NGP]-$A_m$, where A is selected from OY, NHY, O=C—OY, P=C—NR'Y, O=C—SY, O=C—Y, —CR'1-OY, N'Y or C'Y, and Y is an appropriate functional group of a protein, a peptide, an amino acid, an enzyme, an antibody, a nucleotide, an oligonucleotide, an antigen, or an enzyme substrate, enzyme inhibitor or the transition state analog of an enzyme substrate or is selected from R'—OH, R'—$NR'_2$, R'SH, R'CHO, R'CN, R'X, R'$N^+(R')_3X^-$, $R'SiR'_3$, R'Si(—OR'—$)_yR'_{3-y}$, R'Si(—O—$SiR'_2$—)OR', R'—R", R'—N—CO, $(C_2H_4O—)_wH$, (—(—C$_3$H$_3$O—)$_w$H, (—C$_2$H$_4$O)$_w$—R', (C$_3$H$_6$O)$_w$—R', R', and w is an integer greater than one and less than 200.

The NGPs may also be functionalized to produce compositions having the formula: [NGP]—[R'-A]$_m$, where m, R' and A are as defined above. The compositions of the invention also include NGPs upon which certain cyclic compounds are adsorbed. These include compositions of matter of the formula: [NGP]—[X—R$_a$]$_m$, where a is zero or a number less than 10, X is a polynuclear aromatic, polyheteronuclear aromatic or metallopolyheteronuclear aromatic moiety and R is as defined above. Preferred cyclic compounds are planar. More preferred cyclic compounds for adsorption are porphyrins and phthalocyanines. The adsorbed cyclic compounds may be functionalized. Such compositions include compounds of the formula, [NGP]—[X-A$_a$]$_m$, where m, a, X and A are as defined above.

The functionalized NGPs of the instant invention can be prepared by sulfonation, electrophilic addition to deoxygenated platelet surfaces, or metallation. The graphitic platelets can be processed prior to being contacted with a functionalizing agent. Such processing may include dispersing the platelets in a solvent. In some instances the platelets may then be filtered and dried prior to contact. One particularly useful type of functional group is the carboxylic acid moieties, which naturally exist on the surfaces of NGPs if they are prepared from the acid intercalation route discussed earlier. If carboxylic acid functionalization is needed, the NGPs may be subjected to chlorate, nitric acid, or ammonium persulfate oxidation.

Carboxylic acid functionalized graphitic platelets are particularly useful because they can serve as the starting point for preparing other types of functionalized NGPs. For example, alcohols or amides can be easily linked to the acid to give stable esters or amides. If the alcohol or amine is part of a di- or poly-functional molecule, then linkage through the O- or NH-leaves the other functionalities as pendant groups. These reactions can be carried out using any of the methods developed for esterifying or aminating carboxylic acids with alcohols or amines as known in the art. Examples of these methods can be found in G. W. Anderson, et al., "The Use of Esters of N-Hydroxysuccinimide in Peptide Synthesis" J. Amer. Chem. Soc. 86, 1839-1840 (1964), which is hereby incorporated by reference in its entirety. Amino groups can be introduced directly onto graphitic platelets by treating the platelets with nitric acid and sulfuric acid to obtain nitrated platelets, then chemically reducing the nitrated form with a reducing agent, such as sodium dithionite, to obtain amino-functionalized platelets.

The following examples serve to provide the best modes of practice for the present invention and should not be construed as limiting the scope of the invention:

Example 1

Isolated Graphene Sheets from Naphthalene

Isolated graphene sheets were produced from heat treated naphthalene by executing the following procedure: (a) pouring a mass (100 grams) of naphthalene into a stainless steel reactor (5 gallon size); (b) heating the reactor from 150° C. to 450° C. at a rate of 2 degrees per minute and subsequently maintaining the temperature at 450° C. for 4 hours under mechanical shearing conditions (shear rate >100 sec$^-$) to obtain individual graphene planes and graphene domains well-dispersed in a disordered matrix of carbon or hydrocarbon molecules, and (c) pouring 2 gallons of quinolone into the heat-treated mass to dissolve the disordered hydrocarbon molecules, allowing graphene sheets or graphene domains to be suspended as an insoluble component in the quinolone liquid. The insoluble component in the resulting suspension is then isolated by solid-liquid separation (filtration) to become isolated single-layer graphene sheets or few-layer graphene sheets.

Comparative Example 1

NGP Via Hummer's Process

Graphite oxide as prepared by oxidation of graphite flakes with sulfuric acid, nitrate, and permanganate according to the method of Hummers [U.S. Pat. No. 2,798,878, Jul. 9, 1957]. Upon completion of the reaction, the mixture was poured into deionized water and filtered. The graphite oxide was repeatedly washed in a 5% solution of HCl to remove most of the sulphate ions. The sample was then washed repeatedly with deionized water until the pH of the filtrate was neutral. The slurry was spray-dried and stored in a vacuum oven at 60° C. for 24 hours. The interlayer spacing of the resulting laminar graphite oxide was determined by the Debey-Scherrer X-ray technique to be approximately 0.73 nm (7.3 A). This material was subsequently transferred to a furnace pre-set at 650° C. for 4 minutes for exfoliation and heated in an inert atmosphere furnace at 1200° C. for 4 hours to create a low density powder comprised of few-layer reduced graphene oxide (RGO). Surface area was measured via nitrogen adsorption BET.

The RGO sheets were made into a disc of RGO paper 1 mm thick using a vacuum-assisted filtration procedure. The electrical conductivity of this disc of RGO paper was measured using a 4-point probe technique. The conductivity of this RGO disc was found to be approximately 550 S/cm. In contrast, the graphene paper discs made from the graphene sheets using the presently invented process exhibits an electrical conductivity in the range of 1,500 to 4,500 S/cm. The differences are quite significant.

Example 2

Functionalized Graphene Sheets from Anthracene

A mass (100 grams) of anthracene was placed into a stainless steel reactor pre-set at a temperature of 350° C., which was subsequently maintained at the same temperature for 3 hours. Subsequently, diethylenetriamine (DETA) was added and the material mixture was processed at 450° C. for an additional 2 hours under ultrasonication conditions (80-400 W) to obtain amine-functionalized graphene planes and graphene domains well-dispersed in a disordered matrix of hydrocarbon molecules.

In separate experiments, the following functional group-containing species were separately introduced to the aromatic mass being heat-treated: an amino acid, sulfonate group (—SO$_3$H), 2-Azidoethanol, polyamide (caprolactam), and aldehydic group. In general, these functional groups were found to impart significantly improved interfacial bonding between resulting graphene sheets and epoxy, polyester, polyimide, and vinyl ester matrix materials to make stronger polymer matrix composites. The interfacial bonding strength was semi-quantitatively determined by using a combination of short beam shear test and fracture surface examination via scanning electronic microscopy (SEM). Non-functionalized graphene sheets tend to protrude out of the fractured surface without any residual matrix resin being attached to graphene sheet surfaces. In contrast, the fractured surface of composite samples containing functionalized graphene sheets do not exhibit any bare graphene sheets; any of what appears to be graphene sheets were completely embedded in a resin matrix.

Example 3

Isolated Graphene Sheets from Other Polycyclic Aromatic Hydrocarbon Molecules Various PAHs were used as a starting material for producing graphene through the presently invented method. The representative processing conditions and products are summarized in Table 1 below:

TABLE 1

Representative processing conditions and some salient features of products.

| Sample ID | Aromatic molecules | 1st heat treatment | 2nd heat treatment | Chemical or mechanical | Graphene type or thickness |
|---|---|---|---|---|---|
| Ph-1 | Phenanthrene | 250° C. 2 h + 350° C. 3 h | 600° C., 3 h | Ultrasonication | Mostly single-layer |
| Ph-2 | Phenanthrene | 250° C. 2 h + 350° C. 3 h | 600° C., 3 h | None | 5-15 layers |
| Tc-1 | Tetracene | 300° C. 2 h + 400° C. 3 h | 900° C., 3 h | High shear | 1-layer & few-layer |
| Tc-2 | Tetracene | 300° C. 2 h + 400° C. 3 h | 900° C. 3 h | None | 7-20 layers |
| Tc-3 | Tetracene | 300° C. 2 h + 400° C. 3 h | 900° C. 3 h + 1500° C. 2 h | Ultrasonication (at <900° C.) | Few-layer graphene |
| Py-1 | Pyrene | 400° C. 5 h | None | Aryl silane | Single-layer |
| Py-2 | Pyrene | 400° C. 5 h | None | None | 5-10 layers |
| Cn-1 | Coronene | 450° C. 5 h | None | 2-Azidoethanol | Single-layer |
| Cn-2 | Coronene | 450° C. 5 h | None | None | 7-13 layers |
| PP-1 | Petroleum pitch | 300° C. 2 h + 450° C. 3 h | None | Ultrasonication | Few-layer |
| PP-2 | Petroleum pitch | 300° C. 2 h + 450° C. 3 h | None | None | Mesophase spheres |
| CP-1 | Coal tar pitch | 350° C. 2 h + 500° C. 3 h | 900° C. 3 h | Ultrasonication | Few-layer |
| CP-2 | Coal tar pitch | 350° C. 2 h + 500° C. 3 h | None | Ultrasonication | 1-5 layers |
| CP-3 | Coal tar pitch | 350° C. 2 h + 500° C. 3 h | None | None | Mesophase spheres |
| HP-1 | Hexathia-pentacene (HP) | 300° C. 2 h + 450° C. 3 h | None | High shear | 1-3 layers |
| HP-2 | HP | 300° C. 2 h + 450° C. 3 h | None | None | 7-16 layers |
| Tp + An-1 | Triphenylene + anthracene | 300° C. 2 h + 450° C. 3 h | None | aliphatic amines | 1-7 layers |
| Tp − An-2 | Triphenylene + anthracene | 300° C. 2 h + 450° C. 3 h | None | None | 5-15 layers |

All the PAHs herein investigated (e.g. naphthalene, anthracene, phenanthrene, tetracene, chrysene, triphenylene, pyrene, pentacene, benzo-pyrene, corannulene, benzo-perylene, coronene, ovalene, and benzo-fluorene) can be methylated, aminated (derivatized with amine), hydroxylated, chlorinated, brominated, and fluorinated, etc. to obtain derivatives having a substituent on a ring structure thereof. All the derivatives of these PAHs can be used as a starting material for practicing instant invention to produce graphene.

As an example of a PAH derivative, pentacene reacts with elemental sulfur in 1,2,4-trichlorobenzene to the compound hexathiapentacene:

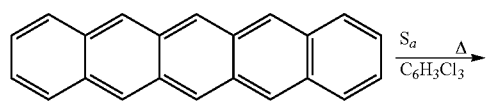 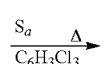

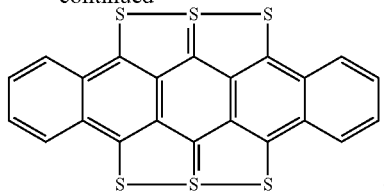

We have observed that such a reaction actually also occurs between S and polycyclic aromatic hydrocarbon molecules having longer and larger fused rings. Thus, larger PAHs, during heat treatments may be prescribed to react with S to obtain S-functionalized graphene sheets or S-functionalized planes in a graphene domain. Such graphene domains tend to have a inter-graphene spacing from 0.45 nm to 6.5 nm, making it easier to produce single-layer graphene by simply subjecting the functionalized domains to ultrasonication.

As another example of the derivative of a PAH, chemical oxidation of anthracene occurs readily in the presence of, for example, hydrogen peroxide and vanadyl acetylacetonate, giving anthraquinone, $C_{14}H_8O_2$, shown below:

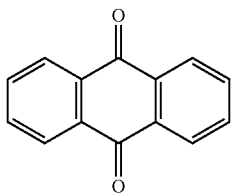 [SMILES: O=C1c2ccccc2C(=O)c2ccccc21]

Essentially all the derivatives of PAHs can be used as a starting material for the production of graphene materials using the presently invented method.

The presently invented method is simple, fast, cost-effective, and generally does not make use of undesirable chemicals. This is quite surprising, considering the fact that previous researchers and manufacturers have focused on more complex, time intensive and costly methods to produce graphene in industrial quantities from graphite. In other words, it has been generally believed that production of graphene requires chemical intercalation and oxidation of carbon or graphite materials using undesirable chemicals, such as sulfuric acid and potassium permanganate. The present invention defies this expectation in many ways:

(1) Unlike the chemical intercalation and oxidation of natural or synthetic graphite (which requires expansion of inter-graphene spaces, further expansion or exfoliation of graphene planes, and full separation of exfoliated graphene sheets), the instant method stops graphene planes from being stacked and merged to become graphite. These graphene planes are isolated to recover graphene sheets before they become part of a graphite material.

(2) The graphene sheets being free of oxidation damage allow for creation of graphene-containing products with higher electrical and thermal conductivity.

(3) Unlike prior art bottom up production methods, large continuous graphene sheets can be produced with the instant method. As discussed earlier, Yang, et al. ["Two-dimensional Graphene Nano-ribbons," J. Am. Chem. Soc. 130 (2008) 4216-17] synthesized nano graphene sheets with lengths of only up to 12 nm from small molecules. The present method typically produces graphene sheets from 12 nm to 10 μm (4) Contrary to common production methods, strong acids and oxidizers are not needed to produce graphene.

(5) Contrary to common production methods, a washing process requiring substantial amounts of water is not needed. The presently invented process is significantly more environmentally benign.

(6) A wide variety of polycyclic aromatic hydrocarbons and their derivatives can be used as a starting material for producing graphene via the presently invented method. All the petroleum or coal pitch materials can be used as a starting material as well.

The invention claimed is:

1. A method of producing isolated graphene sheets, said method comprising:
   a) providing a mass of aromatic molecules in a liquid, solid, or semi-solid state wherein said aromatic molecules are selected from petroleum heavy oil or pitch, coal tar pitch, a polynuclear hydrocarbon, or a combination thereof;
   b) heat treating said mass of aromatic molecules and using chemical or mechanical means to directly form graphene domains dispersed in a disordered matrix of carbon or hydrocarbon molecules without the formation of meso-carbon microbeads, wherein said graphene domains are each composed of from 1 to 30 planes of hexagonal carbon atoms or fused aromatic rings having a length or width from 5 nm to 20 μm and, in the situations wherein there are 2-30 planes in a graphene domain, having an inter-graphene space between two planes of hexagonal carbon atoms or fused aromatic rings no less than 0.4 nm; and
   c) separating and isolating said planes of hexagonal carbon atoms or fused aromatic rings to recover graphene sheets from said disordered matrix without intercalation.

2. The method of claim 1, wherein said polynuclear hydrocarbon is selected from naphthalene, anthracene, phenanthrene, tetracene, chrysene, triphenylene, pyrene, pentacene, benzo-pyrene, corannulene, benzo-perylene, coronene, ovalene, benzo-fluorene, a derivative thereof having a substituent on a ring structure thereof, a chemical derivative thereof, or a combination thereof.

3. The method of claim 1, wherein said graphene domains have a length or width from 10 nm to 5 μm or an inter-graphene space no less than 0.5 nm.

4. The method of claim 1, wherein said graphene domains have an inter-graphene space from 0.5 nm to 2.0 nm.

5. The method of claim 1, wherein said graphene domains have a length or width from 15 nm to 2 μm.

6. The method of claim 1, wherein said chemical means includes functionalizing or derivatizing at least one of said planes of hexagonal carbon atoms or fused aromatic rings.

7. The method of claim 1, wherein said graphene sheets comprise single-layer graphene, double-layer graphene, or triple-layer graphene sheets.

8. The method of claim 1, wherein said heat treating is conducted at a temperature selected from a range of 150° C. to 3,200° C.

9. The method of claim 1, wherein said heat treating is conducted at a temperature selected from a range of 200° C. to 2,500° C.

10. The method of claim 1, wherein said heat treating is conducted at a temperature selected from a range of 300° C. to 1,500° C.

11. The method of claim 1, wherein said heat treating is conducted at a temperature selected from a range of 400° C. to 1,200° C.

12. The method of claim 1, wherein said mechanical means include exposing said mass of aromatic molecules to a gaseous environment, flowing fluid, sonic waves, mechanical shearing, or a combination thereof.

13. The method of claim 1, wherein said step of separating and isolating includes solvent extraction or supercritical fluid extraction of said planes of hexagonal carbon atoms or fused aromatic rings from said disordered matrix to form said graphene sheets.

14. The method of claim 13, wherein said supercritical fluid includes carbon dioxide.

15. The method of claim 1, wherein said step (c) includes a step of dissolving, melting, etching, vaporizing, subliming, burning off, or ultrasonicating said disordered matrix material for separating said graphene sheets.

16. The method of claim 1, wherein said graphene sheets contain at least 80% single-layer graphene or at least 80% few-layer graphene having no greater than 10 graphene planes.

17. The method of claim 1, wherein said graphene sheets contain pristine graphene, oxidized graphene with less than 5% oxygen content by weight, graphene fluoride, graphene fluoride with less than 5% fluorine by weight, graphene with a carbon content no less than 95% by weight, or chemically modified graphene.

18. The method of claim 1 wherein said chemical means contains adding a functionalizing agent into said mass of organic molecules and said organic molecules are chemically functionalized by said agent.

19. The method of claim 18, wherein said functionalizing agent contains a chemical functional group selected from alkyl or aryl silane, alkyl or aralkyl group, hydroxyl group, carboxyl group, amine group, sulfonate group ($-SO_3H$), aldehydic group, quinoidal, fluorocarbon, or a combination thereof.

20. The method of claim 18, wherein said functionalizing agent contains an azide compound selected from the group consisting of 2-Azidoethanol, 3-Azidopropan-1-amine, 4-(2-Azidoethoxy)-4-oxobutanoic acid, 2-Azidoethyl-2-bromo-2-methylpropanoate, chlorocarbonate, azidocarbonate, dichlorocarbene, carbene, aryne, nitrene, (R-)-oxycarbonyl nitrenes, where R=any one of the following groups,

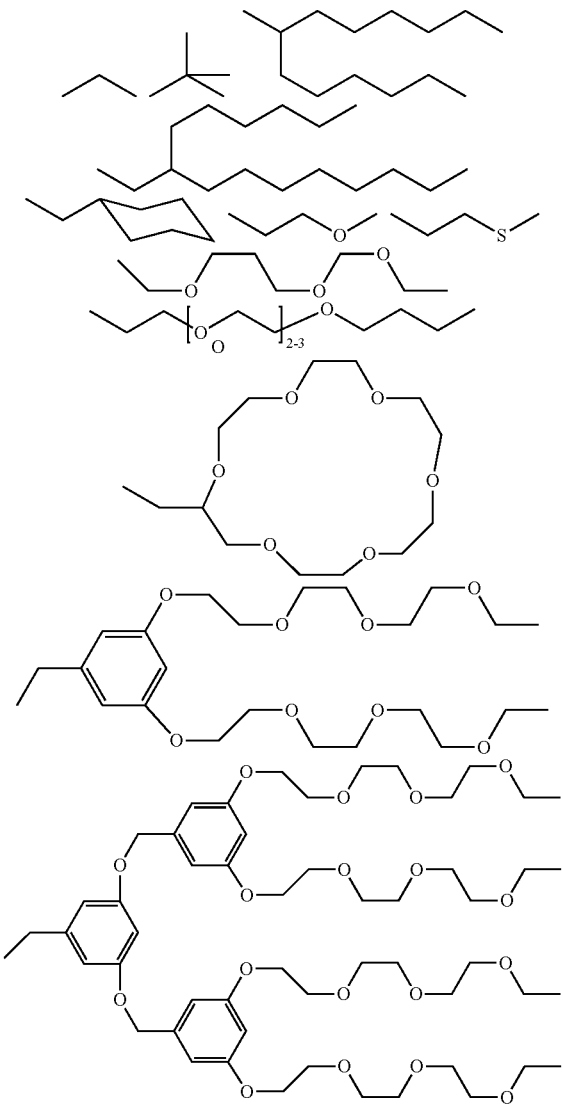

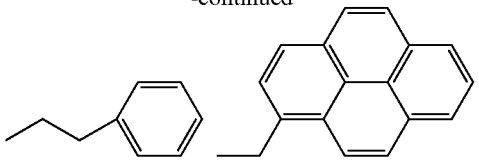

and combinations thereof.

21. The method of claim 18, wherein said functionalizing agent contains an oxygenated group selected from the group consisting of hydroxyl, peroxide, ether, keto, and aldehyde.

22. The method of claim 18, wherein said functionalizing agent contains a functional group selected from the group consisting of $SO_3H$, COOH, $NH_2$, OH, R'CHOH, CHO, CN, COCl, halide, COSH, SH, COOR', SW, $SiR'_3$, $Si(\text{—OR'}\text{—})_y$ $R'_{3-y}$, $Si(\text{—O—SiR'}_2\text{—})OR'$, R''', Li, $AlR'_2$, Hg—X, $TlZ_2$ and Mg—X; wherein y is an integer equal to or less than 3, R' is hydrogen, alkyl, aryl, cycloalkyl, or aralkyl, cycloaryl, or poly(alkylether), R'' is fluoroalkyl, fluoroaryl, fluorocycloalkyl, fluoroaralkyl or cycloaryl, X is halide, and Z is carboxylate or trifluoroacetate, and combinations thereof.

23. The method of claim 18, wherein said functionalizing agent contains a functional group selected from the group consisting of amidoamines, polyamides, aliphatic amines, modified aliphatic amines, cycloaliphatic amines, aromatic amines, anhydrides, ketimines, diethylenetriamine (DETA), triethylene-tetramine (TETA), tetraethylene-pentamine (TEPA), polyethylene polyamine, polyamine epoxy adduct, phenolic hardener, non-brominated curing agent, non-amine curatives, and combinations thereof.

24. The method of claim 18, wherein said functionalizing agent contains a functional group selected from OY, NHY, O=C—OY, P=C—NR'Y, O=C—SY, O=C—Y, —CR'1-OY, N'Y or C'Y, and Y is a functional group of a protein, a peptide, an amino acid, an enzyme, an antibody, a nucleotide, an oligonucleotide, an antigen, or an enzyme substrate, enzyme inhibitor or the transition state analog of an enzyme substrate or is selected from R'—OH, R'—NR'$_2$, R'SH, R'CHO, R'CN, R'X, R'N$^+$(R')$_3$X$^-$, R'SiR'$_3$, R'Si(—OR'—)$_y$ R'$_{3-y}$, R'Si(—O—SiR'$_2$—)OR', R'—R''', R'—N—CO, $(C_2H_4O\text{—})_wH$, $(\text{—}C_3H_6O\text{—})_wH$, $(\text{—}C_2H_4O)_w\text{—R'}$, $(C_3H_6O)_w\text{—R'}$, R', and w is an integer greater than one and less than 200.

25. The method of claim 18, wherein said functionalizing agent contains an acrylonitrile chain, polyfurfuryl alcohol, phenolic resin, or a combination thereof.

* * * * *

UNITED STATES PATENT AND TRADEMARK OFFICE
CERTIFICATE OF CORRECTION

PATENT NO. : 10,526,204 B2
APPLICATION NO. : 15/700756
DATED : January 7, 2020
INVENTOR(S) : Aruna Zhamu and Bor Z. Jang Page 1 of 1

It is certified that error appears in the above-identified patent and that said Letters Patent is hereby corrected as shown below:

In the Claims

Column 22, Line 18: Claim 22 should read:
COCl, halide, COSH, SH, COOR', SR', SiR'3, Si(--OR'--)y Signed and Sealed this
Twenty-fifth Day of February, 2020

Andrei Iancu
*Director of the United States Patent and Trademark Office*